(12) United States Patent
Kryliouk et al.

(10) Patent No.: US 8,222,057 B2
(45) Date of Patent: *Jul. 17, 2012

(54) CRACK FREE MULTILAYERED DEVICES, METHODS OF MANUFACTURE THEREOF AND ARTICLES COMPRISING THE SAME

(75) Inventors: Olga Kryliouk, Sunnyvale, CA (US); Timothy J. Anderson, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/861,614

(22) Filed: Aug. 23, 2010

(65) Prior Publication Data

US 2011/0042683 A1 Feb. 24, 2011

Related U.S. Application Data

(63) Continuation-in-part of application No. 12/257,567, filed on Oct. 24, 2008, and a continuation-in-part of application No. 11/512,615, filed on Aug. 29, 2006.

(51) Int. Cl.
*H01L 21/00* (2006.01)
(52) U.S. Cl. .................. 438/22; 438/48; 257/11; 257/14
(58) Field of Classification Search .................... 257/18, 257/11, 14; 438/22, 48
See application file for complete search history.

(56) References Cited

U.S. PATENT DOCUMENTS

| | | | |
|---|---|---|---|
| 5,310,596 A | 5/1994 | Bigelow et al. | |
| 6,022,622 A | 2/2000 | Domoto et al. | |
| 6,086,673 A | 7/2000 | Molnar | |
| 6,238,980 B1 | 5/2001 | Ueno | |
| 6,339,257 B1 | 1/2002 | Fujiki et al. | |
| 6,406,540 B1 | 6/2002 | Harris et al. | |
| 6,423,983 B1 | 7/2002 | Narayan et al. | |
| 6,447,604 B1 | 9/2002 | Flynn et al. | |
| 6,472,300 B2 | 10/2002 | Nikolaev et al. | |
| 6,476,420 B2 | 11/2002 | Nikolaev et al. | |
| 6,479,839 B2 | 11/2002 | Nikolaev et al. | |
| 6,518,077 B2 | 2/2003 | Narayan et al. | |

(Continued)

FOREIGN PATENT DOCUMENTS

CA 2493503 4/1999

(Continued)

OTHER PUBLICATIONS

Akasaki "The Evolution of Group III Nitride Semiconductors; Seeking Blue Light Emission" Materials Science and Engineering(2000) pp. 101-106.

(Continued)

*Primary Examiner* — Samuel Gebremariam
(74) *Attorney, Agent, or Firm* — Cantor Colburn LLP

(57) ABSTRACT

Disclosed herein is an article comprising a substrate; an interlayer comprising aluminum nitride, gallium nitride, boron nitride, indium nitride or a solid solution of aluminum nitride, gallium nitride, boron nitride and/or indium nitride; the interlayer being directly disposed upon the substrate and in contact with the substrate; where the interlayer comprises a columnar film and/or nanorods and/or nanotubes; and a group-III nitride layer disposed upon the interlayer; where the group-III nitride layer completely covers a surface of the interlayer that is opposed to a surface in contact with the substrate; the group-III nitride layer being free from cracks.

19 Claims, 12 Drawing Sheets

U.S. PATENT DOCUMENTS

| | | | |
|---|---|---|---|
| 6,555,452 B2 | 4/2003 | Nikolaev et al. | |
| 6,559,038 B2 | 5/2003 | Nikolaev et al. | |
| 6,559,467 B2 | 5/2003 | Nikolaev et al. | |
| 6,599,133 B2 | 7/2003 | Nikolaev et al. | |
| 6,610,144 B2 | 8/2003 | Mishra et al. | |
| 6,617,060 B2 | 9/2003 | Weeks, Jr. et al. | |
| 6,627,552 B1 * | 9/2003 | Nishio et al. | 438/694 |
| 6,630,690 B2 | 10/2003 | Edmond et al. | |
| 6,649,287 B2 | 11/2003 | Weeks, Jr. et al. | |
| 6,649,942 B2 | 11/2003 | Hata et al. | |
| 6,692,568 B2 | 2/2004 | Cuomo et al. | |
| 6,720,196 B2 | 4/2004 | Kunisato et al. | |
| 6,773,946 B2 | 8/2004 | Moon et al. | |
| 6,784,085 B2 | 8/2004 | Cuomo et al. | |
| 6,812,508 B2 | 11/2004 | Fukumi | |
| 6,812,518 B2 | 11/2004 | Miida | |
| 6,849,862 B2 | 2/2005 | Nikolaev et al. | |
| 6,967,346 B2 | 11/2005 | Chien et al. | |
| 7,102,173 B2 | 9/2006 | Yi et al. | |
| 7,132,677 B2 | 11/2006 | Kim et al. | |
| 7,217,439 B2 | 5/2007 | Sugino | |
| 7,396,696 B2 | 7/2008 | Kim et al. | |
| 2001/0023942 A1 | 9/2001 | Kim et al. | |
| 2002/0017650 A1 | 2/2002 | Nikolaev et al. | |
| 2002/0047135 A1 | 4/2002 | Nikolaev et al. | |
| 2002/0136932 A1 | 9/2002 | Yoshida | |
| 2003/0155574 A1 | 8/2003 | Doolittle | |
| 2003/0213964 A1 | 11/2003 | Flynn et al. | |
| 2003/0232455 A1 | 12/2003 | Tanaka et al. | |
| 2004/0061119 A1 | 4/2004 | Inoue et al. | |
| 2005/0051766 A1 | 3/2005 | Stokes et al. | |
| 2005/0067935 A1 | 3/2005 | Lee et al. | |
| 2005/0142391 A1 | 6/2005 | Dmitriev et al. | |
| 2005/0164419 A1 | 7/2005 | Hirota et al. | |
| 2005/0179052 A1 | 8/2005 | Yi et al. | |
| 2005/0194598 A1 | 9/2005 | Kim et al. | |
| 2005/0230673 A1 | 10/2005 | Mueller et al. | |
| 2006/0091408 A1 | 5/2006 | Kim et al. | |
| 2007/0045660 A1 | 3/2007 | Yi et al. | |
| 2007/0077670 A1 | 4/2007 | Kim et al. | |
| 2008/0157057 A1 | 7/2008 | Kim | |
| 2008/0185604 A1 | 8/2008 | Kim | |
| 2008/0191191 A1 | 8/2008 | Kim | |
| 2009/0243043 A1 | 10/2009 | Wang | |

FOREIGN PATENT DOCUMENTS

| | | |
|---|---|---|
| JP | 11186178 A | 7/1999 |
| JP | 2002164521 A | 6/2002 |
| JP | 2003022973 A | 1/2003 |
| JP | 2003243316 A | 8/2003 |
| JP | 2004289095 A | 10/2004 |
| JP | 2005001961 | 1/2005 |
| JP | 2005183917 A | 7/2005 |
| WO | 0245140 A2 | 6/2002 |
| WO | 2004057663 A1 | 7/2004 |
| WO | 2005024952 A2 | 3/2005 |
| WO | 2007007954 A1 | 1/2007 |
| WO | 2007021017 A1 | 2/2007 |
| WO | 2007021047 A1 | 2/2007 |
| WO | 2007021069 A1 | 2/2007 |
| WO | 2007032802 A2 | 3/2007 |

OTHER PUBLICATIONS

Akasaki "Progress in Crystal Growth of Nitride Semiconductors" Journal of Crystal Growth (2000) pp. 231-239.

Akasaki "Renaissance and Progress in Nitride Semiconductors—My Personal History of Nitride Research" Material Research Soc. Symposium (2001) pp. G8. 1.1-G8. 1. 12; vol. 639.

Amano, et al. "Improvement of Crystalline Quality of Group III Nitrides on Sapphire using Low Temperature Interlayers" MRS Internet J. Nitride Semiconductor Res. 4S1, G10.1 (1999).

Amano, et al. "Novel Aspects of the Growth of Nitrides by MOVPE" Journal Phys. Condens Matter (2001) pp. 6935-6944; vol. 13.

Amano, et al. "Group III Nitride-Based UV Light Emitting Devices" Phys. Stat. Sol (a) (2003) pp. 491-495; vol. 195; No. 3.

Amano, et al. "Defect and Stress Control of AlGaN for Fabrication of High Performance UV Light Emitters" Phys. Stat. Sol. (a) (2004) pp. 2679-2685; vol. 201, No. 12.

Chen, et al. "A Study of Surface and Interlayer Structures of Epitaxially Grown Group-III Nitride Compound Films on Si (111) Substrates by Second-Harmonic Generation" J. Phys. Condens. Matter (2003) pp. 6537-6548; vol. 15.

Hersee, et al. "Nanoheteroepitaxy for the Integration of Highly Mismatched Semiconductor Materials" IEEE J. Quantum Electronics (2002); pp. 1017-1028; vol. 38, No. 8.

Kikuchi, et al. "InGaN/GaN Multiple Quantum Disk Nanocolumn Light—Emitting Diodes Grown on (111) Si Substrate" Jap. J. App. Phys. (2004) pp. L1524-L1526; vol. 43, No. 12A.

Kusakebe, et al. "Characterization of Overgrown GaN Layers on Nano-Columns Grown by RF-Molecular Beam Epitaxy" Jap. J. App. Phys. (2001) pp. L192-L194; vol. 40, No. 3A.

Liang, et al. "Nanoheteroepitaxy of GaN on a Nanopore Array Si Surface" App. Phys. Lett. (2003) pp. 1752-1754; vol. 83, No. 9.

Qian, et al. "Core/Multishell Nanowire Heterostructures as Multicolor, Hig-Efficiency Light-Emitting Diodes" Nano Letters (2005) pp. 2287-2291; vol. 5, No. 11.

Richter, et al. "Growth Optimization for Thich Crack-Free GaN Layers on Sapphire with HVPE" Phys. Stat. Sol. (c) (2005) pp. 2099-2103, vol. 2, No. 7.

Siegle, et al. "Vertical Strain and Doping Gradients in Thick GaN Layers" Appl. Phys. Lett. (1997) pp. 2490-2492; vol. 71, No. 17.

* cited by examiner (B)

(A)

CRACK FREE MULTILAYERED DEVICES, METHODS OF MANUFACTURE THEREOF AND ARTICLES COMPRISING THE SAME

CROSS-REFERENCE TO RELATED APPLICATIONS

This application is a continuation-in-part (CIP) application of U.S. patent application Ser. No. 11/512,615 filed on Aug. 29, 2006 and U.S. patent application Ser. No. 12/257,567 filed on Oct. 24, 2008, each of which are incorporated by reference in their entireties into the present application.

STATEMENT REGARDING FEDERALLY SPONSORED RESEARCH OR DEVELOPMENT

The United States Government may have certain rights in this invention pursuant to a grant from the U.S. Air Force grant number FA8650-04-2-1619.

BACKGROUND

This disclosure relates to crack free multilayered devices, methods of manufacture thereof and articles comprising the same. In particular, this disclosure relates to crack free group III nitrides disposed on a substrate.

Epitaxial growth of gallium nitride (GaN) occurs on gallium nitride substrates cut from bulk gallium nitride single crystals or on sapphire substrates. The sapphire substrates may be oriented in c-direction, a-direction, r-direction or m-direction; on axis or of-cut. Bulk crystal growth of gallium nitride, however uses extremely high pressures to maintain the nitrogen content in the crystal, rendering bulk growth extremely difficult. For this reason, the high volume production of large size, bulk gallium nitride is improbable in the near future and the search for alternative substrates continues.

Two of the main factors associated with substrate choice are cost and resulting gallium nitride epilayer quality. Silicon is increasingly being used as a substrate for gallium nitride deposition because silicon substrates are available at comparatively low cost, high quality, large area, and in large quantities thus presenting many manufacturing advantages over other available substrates for gallium nitride, such as sapphire and silicon carbide (SiC). The disadvantages of silicon as a substrate for gallium nitride heteroepitaxy include an a-plane +20.5% misfit which led to the conclusion that growth of gallium nitride directly on silicon was unfeasible.

Moreover, the thermal expansion misfit between gallium nitride ($5.6 \times 10^{-6}$ K$^{-1}$) and silicon ($6.2 \times 10^{-6}$ K$^{-1}$) can lead to cracking upon cooling in films grown at high temperature, and, at elevated temperature, melt-back etching between gallium nitride and the silicon substrate during the initial stages of growth or at stress is known to induce cracks that form in gallium nitride films during gallium nitride deposition.

To circumvent these thermal expansion mismatches, a thin aluminum nitride buffer layer is used to absorb the lattice mismatch between the gallium nitride film and the silicon substrate. The subsequent deposition of gallium nitride introduces significant strain into the structure due the large lattice mismatch along with the resultant high density of defects that introduce additional tensile stress into the film. This tensile stress is exacerbated during cool down from growth temperature with macro-crack formation customary for gallium nitride films thicker than 1 micrometer.

To overcome gallium nitride cracking problems, different techniques have been used including multiple aluminum nitride interlayers, aluminum gallium nitride graded layers, patterned silicon, and in situ silicon nitride masking (non-uniform deposition). These methods were reported to provide some decrease in bowing and cracking, but no method successfully produced crack-free thick (e.g. >10 micrometer) gallium nitride films likely because there still remains excessive tensile stress, as well as strong cohesion between gallium nitride (or aluminum nitride buffer layer) and silicon. Although ~7 micrometer thick crack-free gallium nitride on silicon has been reported by incorporating multiple aluminum nitride interlayers, the maximum thickness of a commercially available crack-free gallium nitride layer on silicon is about 1 micrometer.

Cracks can be generated during growth or cooling due to the excess tensile stress caused by large lattice and thermal expansion differences. It has been observed that the cracks penetrate through the silicon substrate and separation occurs inside the silicon substrate. The strong cohesion between gallium nitride and silicon (or aluminum nitride and silicon in a system comprising gallium nitride/aluminum gallium nitride/aluminum nitride/silicon) as well as the brittleness of silicon, are responsible for cracking to take place in the interior of the silicon wafer. The bond strength of Si—Si is 7 electron Volts (eV), which is lower than the gallium nitride (8.9 eV) or Al—N (11.5 eV) and Si—N (10.5 eV). The bond strength of Si—Si is the weakest. The nano-indentation hardnesses of the GaN, MN, and Si are 20, 18 and 14 gigapascals (GPa) respectively. Therefore, the cracking penetration to the silicon substrate was expected. This brittleness of silicon added with the large tensile stress created by the lattice mismatch and thermal expansion differences makes the growth of crack-free gallium nitride on silicon even more challenging.

SUMMARY

Disclosed herein is an article comprising a substrate; an interlayer comprising aluminum nitride, gallium nitride, boron nitride, indium nitride or a solid solution of aluminum nitride, gallium nitride, boron nitride and/or indium nitride; the interlayer being directly disposed upon the substrate and in contact with the substrate; where the interlayer comprises a columnar film and/or nanorods and/or nanotubes; and a group-III nitride layer disposed upon the interlayer; where the group-III nitride layer completely covers a surface of the interlayer that is opposed to a surface in contact with the substrate; the group-III nitride layer being free from cracks.

Disclosed herein too is a method comprising disposing on a substrate an interlayer comprising interlayer comprising aluminum nitride, gallium nitride, boron nitride, indium nitride or a solid solution of aluminum nitride, gallium nitride, boron nitride and/or indium nitride; the interlayer being directly disposed upon the substrate and in contact with the substrate; where the interlayer comprises a columnar film and/or nanorods and/or nanotubes; and disposing on the interlayer a group-III nitride layer; where the group-III nitride layer is free from cracks.

DETAILED DESCRIPTION

Figure 1:
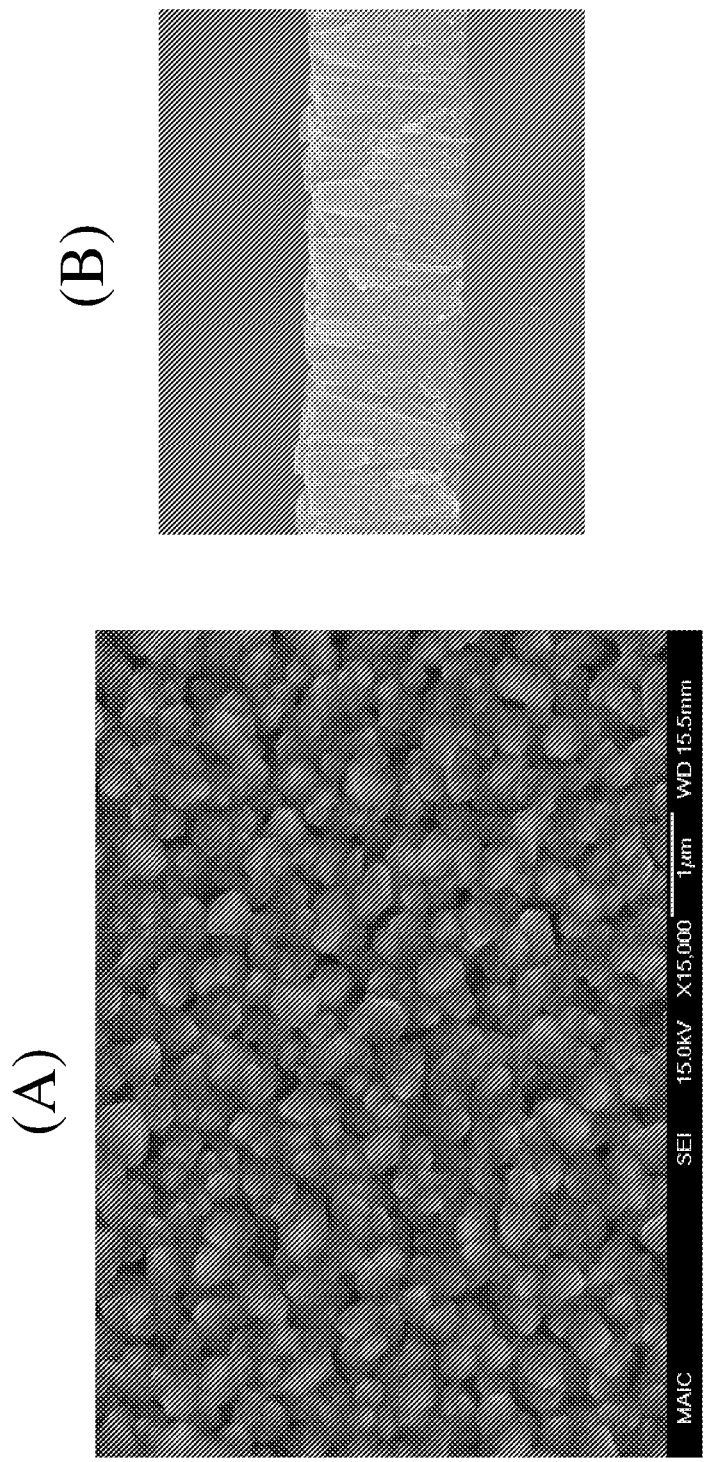
FIG. 1 is a SEM image showing a columnar group III-nitride film.

It is to be noted that as used herein, the terms "first," "second," and the like do not denote any order or importance, but rather are used to distinguish one element from another, and the terms "the", "a" and "an" do not denote a limitation of quantity, but rather denote the presence of at least one of the referenced item. Furthermore, all ranges disclosed herein are inclusive of the endpoints and independently combinable. The term "and/or" represent both "and" as well as "or". For example, the statement "an interlayer that is selected from the group consisting of indium nitride, gallium nitride, boron nitride, aluminum nitride and all solid solutions of aluminum nitride, indium nitride boron nitride and/or gallium nitride" is meant to be interpreted as "an interlayer that is selected from the group consisting of indium nitride, gallium nitride, boron nitride, aluminum nitride, aluminum indium nitride, indium boron nitride, aluminum boron nitride, gallium boron nitride, aluminum gallium nitride, gallium indium nitride, aluminum indium gallium nitride, indium gallium boron nitride, aluminum gallium boron nitride, aluminum gallium boron nitride, indium aluminum boron nitride, and aluminum gallium indium boron nitride."

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. Further all numbers used in various ranges are interchangeable and can be combined in any manner desirable so long as they can physically exist in a selected range or form.

The transition phrase "comprising" is inclusive of the transition phrases "consisting essentially of" and "consisting of".

Disclosed herein is a multilayered article that comprises a substrate with a group III-nitride layer disposed on the substrate. Disposed between the substrate and the group III-nitride layer is an interlayer that is selected from the group consisting of indium nitride, gallium nitride, boron nitride, aluminum nitride and all solid solutions of aluminum nitride, indium nitride boron nitride and/or gallium nitride. By disposing the group III-nitride layer on an interlayer that comprises indium nitride, gallium nitride, boron nitride, aluminum nitride or solid solutions of aluminum nitride, indium nitride, boron nitride and/or gallium nitride, the group III-nitride layer is crack free and can be developed to a thickness of about 1 to about 600 micrometers.

There is no restriction to the material that is used as the substrate. The substrate generally comprises a semiconductor. In one embodiment, the substrate can comprise silicon, silicon carbide-sapphire, $LiAlO_2$, $LiGaO_2$, gallium arsenide, glass, alumina, titania, zirconia, germanium, a combination of germanium and silicon, aluminum nitride, indium nitride, boron nitride, gallium nitride or a solid solution of aluminum nitride, indium nitride, boron nitride and/or gallium nitride, quartz, and glass. The solid solutions of aluminum nitride, indium nitride, boron nitride and/or gallium nitride includes aluminum indium nitride, indium boron nitride, aluminum boron nitride, gallium boron nitride, aluminum gallium nitride, gallium indium nitride, aluminum indium gallium nitride, indium gallium boron nitride, aluminum gallium boron nitride, aluminum gallium boron nitride, indium aluminum boron nitride, and aluminum gallium indium boron nitride.

In one embodiment, it is desirable for the substrate to exist in the form of a single crystal. A single crystal solid is a material in which the crystal lattice of the entire sample is continuous and unbroken to the edges of the sample, with no grain boundaries. In one embodiment, a single crystal silicon, alumina or germanium may be used as the substrate.

In an exemplary embodiment, the substrate comprises a single crystal silicon that is preferably oriented in the (111) direction or in the (100) direction. The silicon substrate preferably has a buffer layer disposed thereon. In one embodiment, the buffer layer comprises silicon dioxide, silicon oxynitride or a native group-III nitride layer. The buffer layer preferably has a thickness of about 15 to about 20 Angstroms. In one embodiment, the buffer layer contains nuclei that are used for nucleating an interlayer that comprises self aligned nanorods. The silicon dioxide buffer layer and the native group-III nitride layer functions as a nucleating agent and permits the nanorods to nucleate and to grow on the substrate.

The substrate generally has a thickness of about 100 to about 900 micrometers, specifically about 200 to about 800 micrometers, and more specifically about 300 to about 500 micrometers. The substrate has a smooth surface upon which an interlayer is disposed. It is desirable for the substrate to have a non-textured surface.

Disposed upon the substrate is an interlayer. The interlayer serves to reduce the large thermal and lattice mismatch that exists between the substrate and the group-III nitride layer. The reduction of the thermal and lattice mismatch between the substrate and the group-III nitride layer permits the group-III nitride layer to be crack free. The interlayer is selected from the group consisting of indium nitride, gallium nitride, aluminum nitride and all solid solutions of aluminum nitride, indium nitride and gallium nitride. In one embodiment, the interlayer is selected from the group consisting of indium nitride, gallium nitride, aluminum nitride, boron nitride, indium aluminum nitride, gallium aluminum nitride, gallium indium nitride, or the like, or a combination comprising at least one of the foregoing nitrides. The interlayer could be selected from the same material as the substrate itself.

The interlayer can comprise a columnar film, aligned nanorods/nanowires or randomly oriented nanorods/nanowires/ nanotubes. A combination comprising the columnar film, aligned nanorods and/or randomly oriented nanorods may also be disposed upon the substrate. The interlayer has a nano-indentation hardness that is less than the nano-indentation hardness of the substrate or of the group-III nitride. The disposing of the columnar film, the aligned nanorods or the randomly oriented nanorods facilitates the manufacturing of a crack free group III-nitride layer on the interlayer. In one embodiment, the interlayer is directly disposed on the substrate without any intervening layers and contacts the substrate.

In one embodiment, the interlayer comprises a chemical composition represented by the Equation (I):

$$A_xB_yC_zN \qquad (I)$$

where x+y+z=1 and x is an amount of about 0 to about 1, y is an amount of about 0 to about 1 and z is an amount of about 0 to about 1. A, B and C can be the same or different and can be selected from amongst indium, aluminum, boron or gallium and N represents nitrogen.

The interlayer has a thickness of about 50 nanometers to about to about 2 micrometers, specifically about 75 nanometers to about 1.5 micrometers and more specifically about 100 nanometers to about 1 micrometers.

When the interlayer comprises a columnar film, the respective columns have an average column diameter of about 0.1 micrometer to about 1 micrometer, specifically 0.2 micrometers to about 0.75 micrometers, and more specifically about 0.3 micrometers to about 0.5 micrometers. In one embodiment, the average column diameter is a number average column diameter.

The average height of the columns in a columnar film is about 0.1 micrometer to about 5 micrometers, specifically about 0.2 to about 0.7 micrometers, and more specifically about 0.3 to about 0.5 micrometers.

The columns are very closely spaced. The column density is about 5 to about 15 columns per square micrometer, specifically about 7 to about 12 columns per square micrometer and more specifically 8 to about 11 columns per square micrometer. In an exemplary embodiment, the average column density is about 5 to about 15 columns per square micrometer, specifically about 7 to about 12 columns per square micrometer and more specifically 8 to about 11 columns per square micrometer. The columns have an average cross-sectional area (measured parallel to the substrate) of about 0.01 square micrometer to about 0.25 square micrometer, more specifically about 0.05 to about 0.2 square micrometers, and even more specifically about 0.09 to about 0.15 square micrometers.

Average spacing between columns in the columnar films is less than 50 nanometers, specifically less than 20 nanometers, and more specifically less than 10 nanometers.

Figure 2:
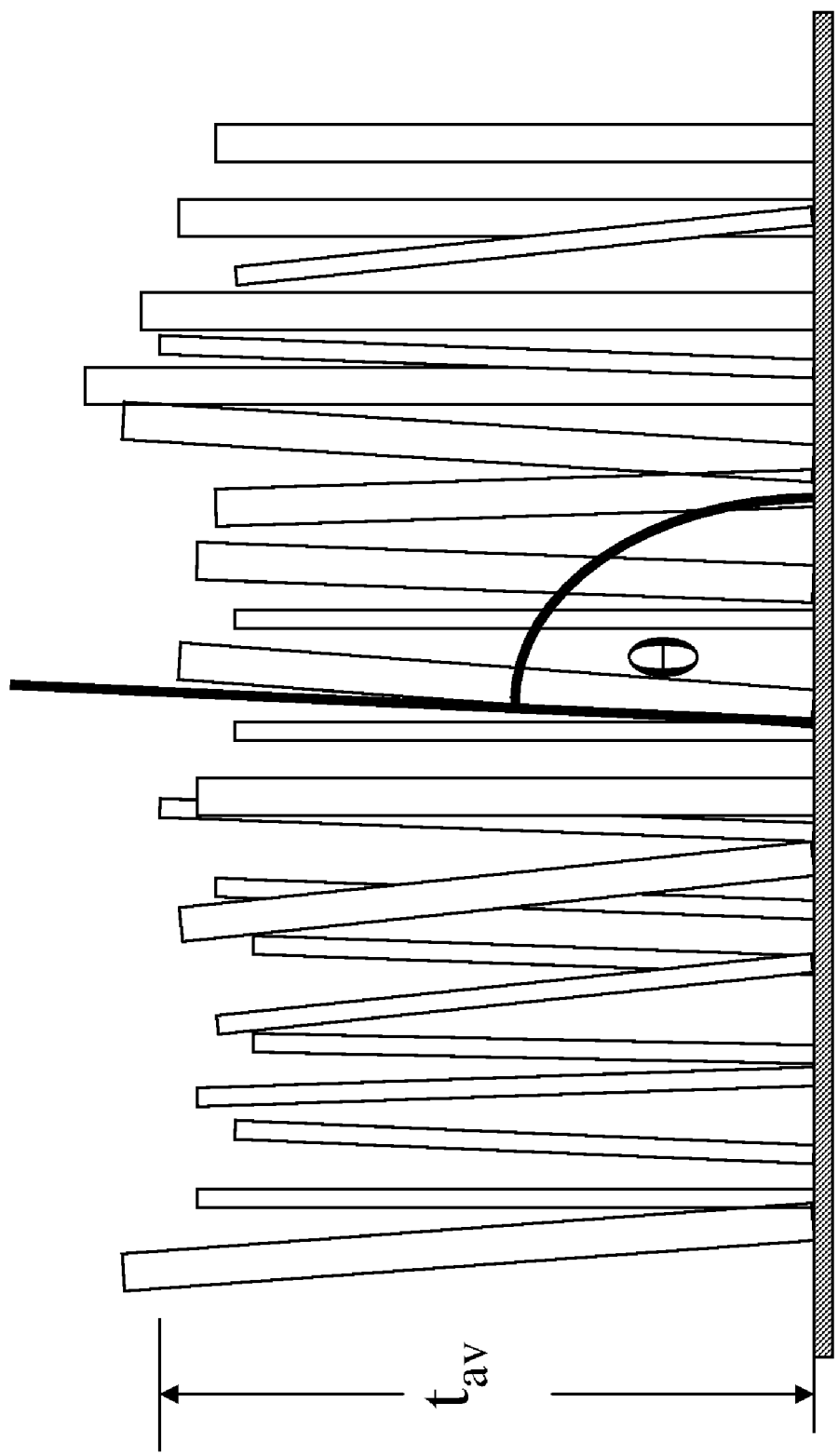
FIG. 2 is an exemplary schematic diagram of a columnar film.

In the columnar film, the columns are generally aligned in a given direction. FIG. 1 is a photomicrograph depicting a columnar film prepared from a group III-nitride. The FIG. 1(A) depicts a top view of the columnar film, while the FIG. 1(B) depicts a side view of the columnar film. FIG. 2 is an exemplary schematic diagram of a columnar film. The columns of the columnar film generally have heights that do not vary from the average height by an amount of greater than or equal to about 10%, specifically by an amount of greater than or equal to about 15%, and more specifically by an amount of greater than or equal to about 20%. The FIG. 2 depicts the average height "$t_{av}$" for the columnar film.

The columns of the columnar film have an orientation that does not exceed the average orientation of the columns by an angle of greater than or equal to about 10 degrees, specifically by an angle of greater than or equal to about 15 degrees, and more specifically by an angle of greater than or equal to about 25 degrees. The average orientation is measured with respect to the substrate upon which the columns are disposed. FIG. 2 shows how the average orientation is measured. In the FIG. 2, the average orientation is measured by an angle 'θ' with respect to the substrate. In an exemplary embodiment, it is desirable to have all the columns of the columnar film be substantially parallel to one another and substantial perpendicular to the substrate upon which the columnar film is disposed.

In one embodiment, the nanorods of the interlayer are formed in conjunction with the columnar film on the substrate. In other words, the interlayer can comprise nanorods and the columnar film. In another embodiment, the nanorods can also be formed in lieu of the columnar film. The nanorods can be well aligned or randomly aligned. The well aligned nanorods can be self aligned. In one embodiment, the interlayer can comprise a first region that comprises well aligned nanorods and a second region that comprises randomly aligned nanorods. The first and second regions can exist in the form of interspersed domains on the substrate. The nanorods are single crystals that are dislocation free and have a growth axis oriented in the (001) direction.

In one embodiment, in order to form well aligned nanorods in the interlayer it is desirable to have a buffer layer disposed on the substrate. The buffer layer can comprise silica. Alternatively, the buffer layer can comprise a layer of native group-III nitrides on a native substrate. The term "native" refers to the material of the substrate. For example, for a substrate that comprises "gallium nitride", the native group-III nitride would be gallium nitride or an alloy of gallium nitride.

For example, in order to grow well aligned indium nitride nanorods on a gallium nitride substrate, a layer of indium gallium nitride is disposed on the substrate. The layer of indium gallium nitride may be formed during the manufacturing of the indium nitride nanorods in the interlayer. Without being limited to theory, it is believed that nucleation starts from indium nitride nanocrystallites formed on the gallium nitride substrate. Indium gallium nitride may be formed at the interface by inter-diffusion of indium and gallium. It is further believed that the indium gallium nitride nuclei are epitaxial, so that the growth will replicate some of the crystalline structure of the substrate. The concentration of the indium will gradually increase during the indium nitride nanorod growth and graded indium gallium nanorods serve as the base.

Thus in order to produce aligned nanorods, it may be desirable to have nuclei of a native group-III nitride or an alloy of a native group-III nitride disposed upon the substrate. As noted above, the nanorods or the columnar film can have a graded structure where one end of the nanorods or the columnar film possess a higher concentration of the material of the substrate when compared with the opposing end of the nanorods or the columnar film.

The nanorods generally have larger spaces disposed between them when compared with the columns of the columnar film. In one embodiment, the aligned nanorods are substantially aligned in the c-direction (i.e., perpendicular to the substrate). The aligned nanorods have an orientation that does not exceed the average orientation of the nanorods by an angle of greater than or equal to about 2 degrees, specifically by an angle of greater than or equal to about 3 degrees, and more specifically by an angle of greater than or equal to about 5 degrees. The average orientation of the aligned nanorods is substantially perpendicular to the substrate. In one embodiment, the average orientation is a number average orientation.

In one embodiment, in order to create self aligned nanorods the chemical composition of the substrate is similar to that of the composition of the interlayer. For example, when gallium nitride is used as the substrate, self aligned nanorods comprising gallium nitride can be grown on the substrate.

The nanorods generally have an average diameter of about 0.1 to about 0.7 micrometers, specifically about 0.2 to about 0.6 micrometers, and more specifically about 0.3 to about 0.5 micrometers. In one embodiment, the average diameter is a number average diameter.

The nanorods are generally not as closely spaced as the columns in the columnar film. The average density of nanorods is greater than or equal to about 30 nanorods per square micrometer, greater than or equal to about 50 nanorods per square micrometer, and more specifically greater than or equal to about 100 nanorods per square meter.

Figure 11:
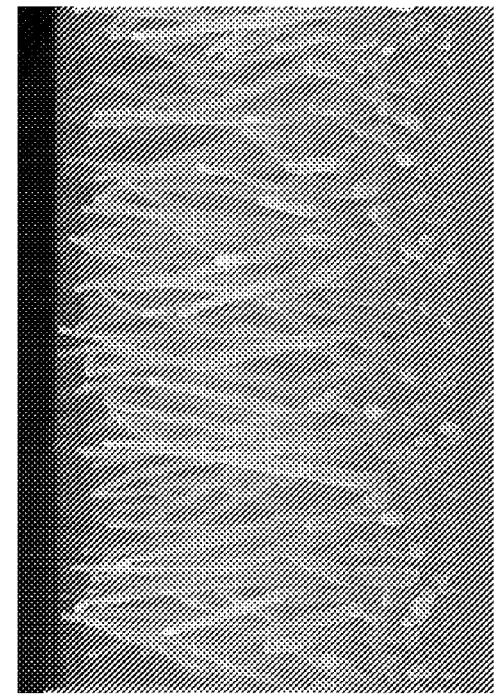
FIG. 11 is a micrograph depicting randomly oriented nanorods that form the interlayer.
Figure 11:
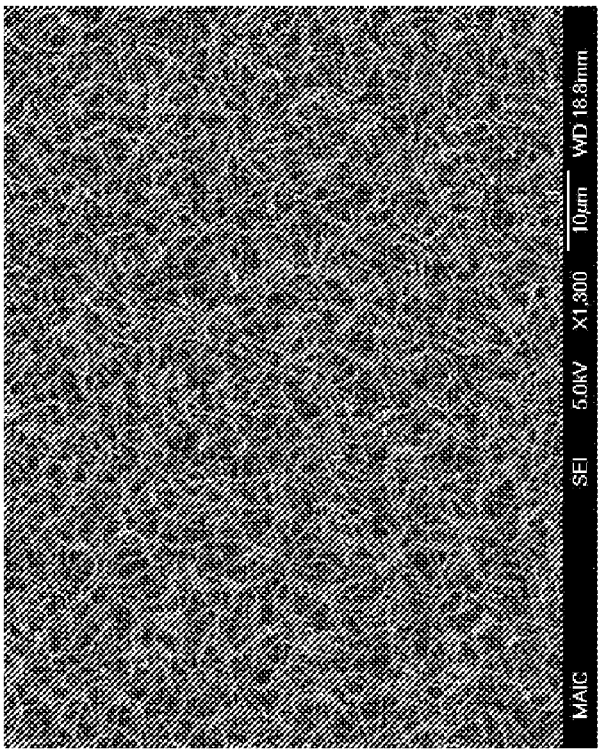

Average spacing between nanorods is greater than or equal to about 50 nanometers, specifically greater than or equal to about 75 nanometers, and more specifically greater than or equal to about 100 nanometers. Nanorods are depicted in the FIGS. 11(A) and (B).

Figure 12:
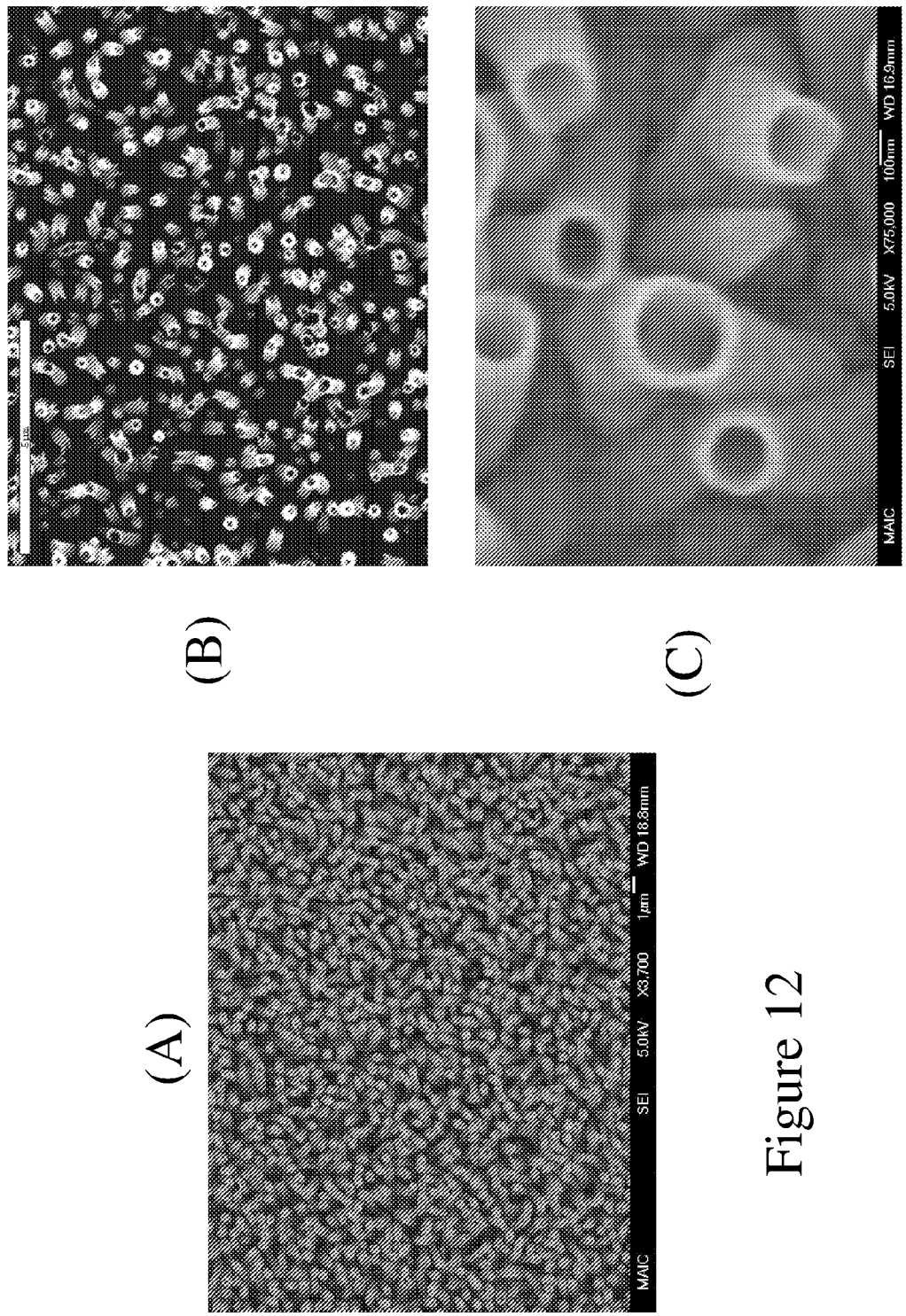
FIG. 12 is a micrograph depicting nanotubes that form the interlayer.

In one embodiment, the interlayer comprises nanotubes as shown in the FIG. 12. Nanotubes depicted in the FIGS. 12(A), (B) and (C) have average diameters of about 5 micrometers to about 15 micrometers, specifically about 8 to about 12 micrometers. In an exemplary embodiment, the nanotubes have average diameters of about 10 micrometers. The nanotubes may comprise indium nitride, indium gallium nitride or gallium nitride.

Disposed upon the interlayer is a layer that comprises group-III nitrides. The group-III elements whose nitrides may be used in the group-III nitride layer are aluminum, boron, gallium, indium and thallium. The group-III nitrides are selected from the group consisting of indium nitride, gallium nitride, aluminum nitride, boron nitride and all solid solutions of aluminum nitride, indium nitride, gallium nitride and boron nitride. In one embodiment, the group-III nitrides are selected from the group consisting of indium nitride, gallium nitride, aluminum nitride, boron nitride, indium aluminum nitride, gallium aluminum nitride, gallium indium nitride, boron indium nitride, boron gallium nitride, boron aluminum nitride, or the like, or a combination comprising at least one of the foregoing nitrides.

In one embodiment, the group-III nitride layer is disposed directly on the interlayer and is directly in contact with it. In an exemplary embodiment, the group-III nitride layer completely covers a surface of the interlayer that is opposed to the surface in contact with the substrate. The group-III nitride layer is crack free and has a thickness of about 0.1 micrometer to about 15 micrometers, specifically about 2 to about 10 micrometers and more specifically about 3 to about 8 micrometers. The nanorods or columns of the interlayer do not protrude through the group-III nitride layer. In one embodiment, the group-III nitride layer has a smooth surface opposite to the surface that is in contact with the interlayer. A smooth surface is defined as one having a roughness factor of less than or equal to 2.

In one embodiment, in one method of manufacturing the multilayered article, a surface of a substrate is first cleaned to remove any traces of impurity. The cleaned surface may then be oxidized to develop a layer of a native oxide. Alternatively, a non-native layer of a metal oxide may be disposed on the substrate. The layer of the metal oxide serves as a surface for nucleation of the self aligned nanorods or for nucleation of the columns of the columnar film.

Figure 3B:
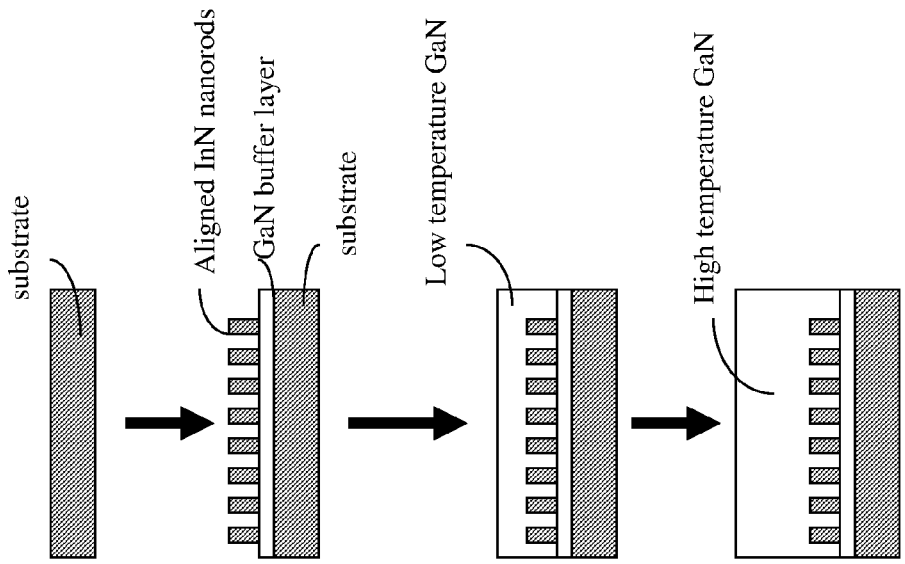
FIGS. 3(A) and (3B) show the formation of non-cracked gallium nitride layers on a substrate.
Figure 3A:
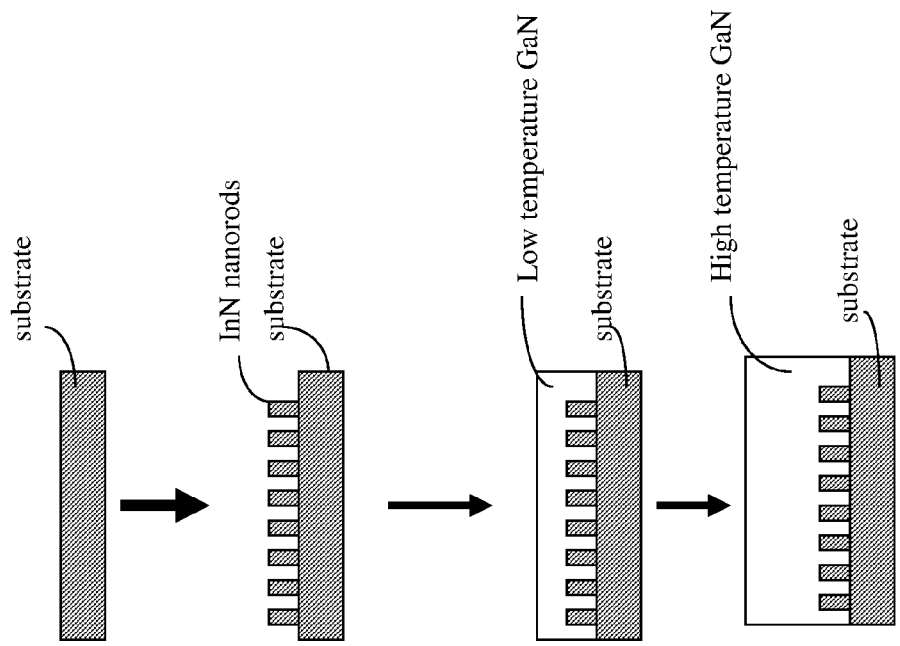

The FIG. 3 depicts two methods of manufacturing the multilayered article. In the FIG. 3(A), a substrate has disposed upon it indium nitride nanorods. A low temperature gallium nitride layer is first disposed upon the substrate, following which a high temperature gallium nitride layer is then disposed upon the low temperature gallium nitride layer. The indium nitride nanorods are formed at 600° C. The low temperature gallium nitride layer is formed at temperatures of about 500 to about 600° C., specifically at about 560° C. The high temperature gallium nitride layer is formed at temperatures of about 800 to about 900° C., specifically at about 850° C.

In the FIG. 3(B) a gallium nitride buffer layer is first disposed upon the substrate, following which indium nitride nanorods are formed at a temperature of 600° C. A low temperature gallium nitride layer is then formed on the aligned indium nitride nanorods at a temperature of 560° C. A high temperature gallium nitride layer is formed at a temperature of about 850° C.

In another exemplary embodiment, if indium nitride or a high indium content indium gallium nitride is used to form the interlayer, a low temperature gallium nitride buffer (where the low temperature is about 550 to about 600° C.) is first disposed on those nanorods or columnar film to protect from them from decomposition during the high temperature gallium nitride growth. When the interlayer comprises gallium nitride or a combination of aluminum gallium nitride and aluminum boride then the low temperature gallium nitride layer may not be desirable.

The interlayer growth can be performed by reacting upon the surface of the substrate a first reactive precursor that comprises aluminum, gallium or indium with a first halogen containing compound (e.g., chlorine ($Cl_2$), hydrogen chloride (HCl), hydrogen fluoride (HF), chlorine trifluoride ($ClF_3$)), a first reducing agent (e.g., ammonia, hydrogen), and a first nitrogen containing compound (e.g., nitrogen).

Exemplary first reactive precursors are boron tribromide, trimethylaluminum (TMAl), ethyldimethylindium, boron trichloride ($BCl_3$), trimethylgallium (TMGa), triethylgallium (TEGa), trimethylindium (TMIn), triethylindium (TEIn), GaCl/$GaCl_3$, InCl/$InCl_3$, AlCl/$AlCl_3$, BCl/$BCl_3$, or the like, or a combination comprising at least one of the foregoing reactive precursors.

Figure 4:
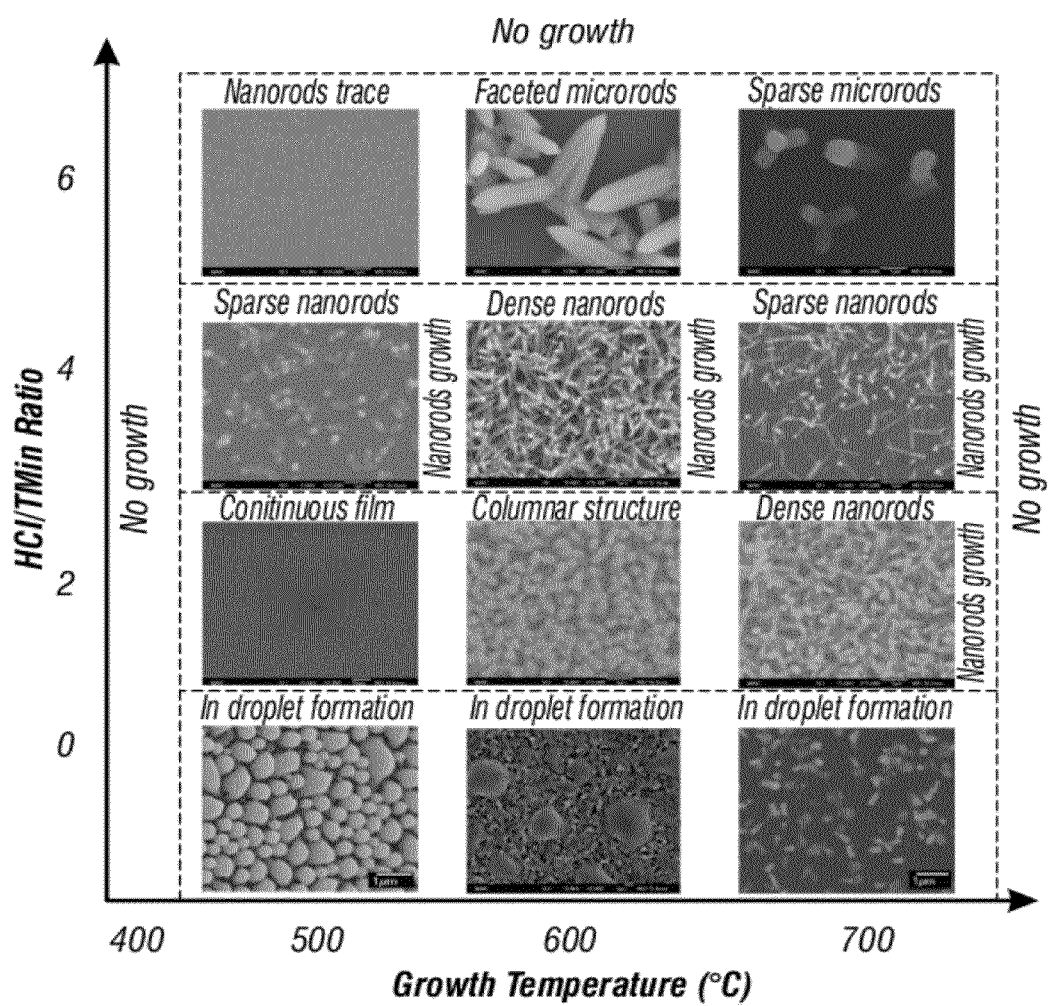
FIG. 4 is a graph showing the different types of structures obtained as the ratio of the first halogen containing compound (HCl) to the first reactive precursor (trimethylindium (TMIn) and growth temperature.

The reaction to form the interlayer can be conducted at temperatures of about 400 to about 800° C., specifically about 500 to about 700° C., and more specifically about 550 to about 650° C. The temperature at which the reaction is conducted, the ratio of the first halogen containing compound to the first reactive precursor and the ratio of the first nitrogen containing compound to the first reactive precursor can determine the type of structure generated in the interlayer. The FIG. 4 is a graph showing the different types of structures obtained as the ratio of the first halogen containing compound (HCl or $Cl_2$) to the first reactive precursor (trimethylindium (TMIn)) is varied from 0 to a value greater than or equal to about 6 when the temperature is varied from 400° C. to about 700° C. From the FIG. 4 it may be seen that at low growth temperatures (about 450 to about 550° C.) and lower ratios of HCl to TMIn (about 0 to about 2) nucleation takes place in the form of droplets. However, the droplets formed at temperatures of 450 to about 550° C. have a relatively large size of about 0.5 to about 1 micrometer. As the temperature is elevated to about 550 to about 650° C. and the HCl to TMIn ratio is increased to about 1 to about 4, nucleation of either columnar films or nanorods begins. At HCl to TMIn ratios of about 1 to about 3 columnar structures are formed, while at higher ratios of HCl to TMIn a dense array of randomly aligned nanorods are produced. At temperatures of about 650 to about 750° C. and at HCl to TMIn ratios of about 1 to about 3, self aligned nanorods are produced. For all of the structures produced in the FIG. 4, the molar ratio of nitrogen to TMIn is 250. While the structures in the FIG. 4 were created using TMIn as the first reactive precursor, it is possible to create an interlayer by using a combination of precursors as the first reactive precursors.

Thus, by selecting the appropriate ratios of the first halogen containing compound to the first reactive precursor, the appropriate ratios of the first nitrogen containing compound to the first reactive precursor, and the appropriate temperature, a suitable interlayer can be disposed on the surface of the substrate. By generating a suitable interlayer on the substrate, it is possible to generate a crack-free group-III nitride layer on the substrate and to generate a crack-free multilayer article.

In one embodiment, by using a molar ratio of the first halogen containing compound to the first reactive precursor of about 1 to about 12, specifically about 1.5 to about 9, more specifically about 2 to about 7 and more specifically about 3 to about 6, a suitable interlayer comprising either a columnar film, nanorods or both columnar films and nanorods may be produced.

In another embodiment, by using a ratio of the first nitrogen containing compound to the first reactive precursor of about 50 to about 500, specifically about 100 to about 300, and more specifically about 150 to about 275, a suitable interlayer comprising a columnar film, nanorods or both columnar films and nanorods may be produced.

In another embodiment, by conducting the reaction between the first reactive precursor, the first halogen containing compound and the first nitrogen containing compound at temperatures of about 300 to about 1,200° C., specifically about 400 to about 1,000° C., and more specifically about 500 to about 700° C., a suitable interlayer comprising a columnar film, nanorods or both columnar films and nanorods may be produced.

Following the manufacturing of the interlayer, the group-III nitride layer is disposed on the interlayer. The group-III nitride layer may be disposed on the interlayer in a single operation or in a multiple step operation. The group-III nitride layer is disposed on the interlayer by reacting a second reactive precursor with a second halogen containing compound, a second nitrogen containing compound and a second reducing agent. The second reactive precursor, the second halogen containing compound and the second nitrogen containing compound may be selected from the aforementioned lists of chemicals that are shown for the first reactive precursor, the first halogen containing compound and the first nitrogen containing compound. The ratios for the second halogen containing compound to the second reactive precursor and the ratio of the second nitrogen containing compound to the second reactive precursor can be the same as the ratios for the first halogen containing compound to the first reactive precursor and the ratio of the first nitrogen containing compound to the first reactive precursor respectively.

In one embodiment, the first reactive precursor can be the same or different from the second reactive precursor. The first halogen containing compound can be the same or different from the second halogen containing compound. The first nitrogen containing compound can be the same or different from the second nitrogen containing compound.

As noted above, the group-III nitride layer can be grown in a multiple step operation. A first layer of the group-III nitride layer is first disposed on the interlayer at a first temperature and a second layer of the group-III nitride layer is disposed on the first layer at a second temperature. The second temperature is greater than the first temperature by about 150° C. In one embodiment, the first layer of the group-III nitride layer can be the same or different from the second layer.

The first layer of the group-III nitride layer is generally called the low temperature layer because it is deposited at a temperature of about 500 to about 600° C., while the second layer is called the high temperature layer because it is deposited at a temperature of about 700 to about 900° C. In an exemplary embodiment, the group-III nitride layer comprises gallium nitride (GaN). The group-III nitride layer can be disposed on the interlayer by chemical vapor deposition process including atmospheric pressure CVD (APCVD), low-pressure CVD (LPCVD), ultrahigh vacuum CVD (UHVCVD), aerosol assisted CVD (AACVD), direct liquid injection CVD (DLICVD), microwave plasma-assisted CVD (MPCVD), plasma-enhanced CVD (PECVD), remote plasma-enhanced CVD (RPECVD), atomic layer CVD (ALCVD), combustion CVD (CCVD), hot wire CVD (HWCVD) or hot filament CVD (HFCVD), metalorganic chemical vapor deposition (MOCVD), hybrid physical CVD (HPCVD), vapor phase epitaxy (VPE), hydride vapor phase epitaxy (HVPE), hybrid metal organic phase epitaxy (HMOVPE), or the like.

Following the manufacturing of the group-III nitride layer, it can be annealed in one of two ways. These are as follows:

a) in-situ slowly cooling down to room temperature under ambient conditions (after the growth when the reactor is shut off from the growth).

b) After growth, annealing in nitrogen or ammonia at the growth temperature (700 to 900° C. for a period of 15 to 30 minutes).

The group-III nitride layer is generally crack-free and has a thickness of greater than or equal to about 1 micrometer, specifically greater than or equal to about 5 micrometers, and more specifically greater than or equal to about 10 micrometers, and more specifically greater than or equal to about 25 micrometers.

The group-III nitride layer manufactured in this manner on the interlayer is crack free. Group-III nitride layers having a thickness of at least about 10 micrometers can be manufactured without any cracks because the interlayer accommodates for thermal and lattice mismatches between the substrate and the group-III nitride layer. The multilayered articles thus manufactured can be used in chips, integrated circuits, light emitting diodes, electronic or optoelectronic device applications and computational devices.

The following examples, which are meant to be exemplary, not limiting, illustrate compositions and methods of manufacturing of some of the various embodiments of the articles described herein.

EXAMPLES

Example 1

This example was conducted to demonstrate the preparation of interlayers that comprise nanorods as well as interlayers that comprise columnar films. As detailed above, the surface morphology of the interlayer is dependent upon the temperature, the ratio of the halogen containing compound to the first reactive precursor and the ratio of the nitrogen containing compound to the first reactive precursor. In this example, trimethylindium was used as the reactive precursor, hydrochloric acid was used as the halogen containing compound and ammonia was used as the nitrogen containing compound. The resulting interlayer comprises indium nitride.

The substrate comprised either single crystal silicon having a (111) orientation and was 500 micrometers thick. The substrate was first cleaned to remove any traces of impurities. No buffer layer was formed on the substrate. In other words, the respective substrates did not contain any silicon dioxide layer. The substrates were heated to 550 or 600° C. respectively. The mole ratio of the halogen containing compound to the first reactive precursor is either 1 or 4. The mole ratio of the ammonia to the first reactive precursor is 250.

The results are depicted as scanning electron micrographs and x-ray diffraction spectra.

Figure 5:
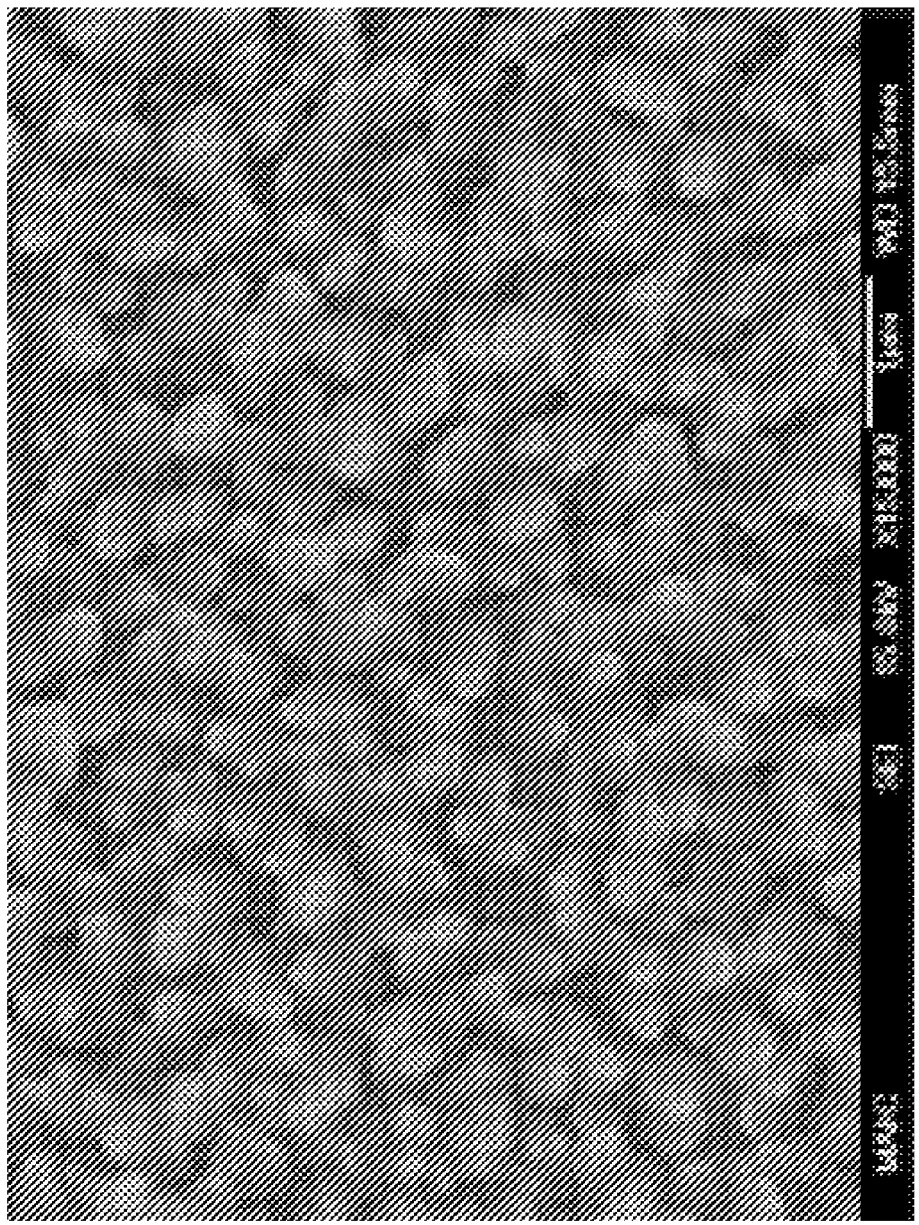
FIG. 5 is a micrograph that shows a columnar film.

When the lower temperature of 550° C. was used for conducting the reaction and the ratio of hydrochloric acid to trimethylindium was 1, a columnar film was produced on the silicon substrate and the alumina substrate. The columnar film is depicted in the micrograph of the FIG. 5. The columnar film contains indium nitride columns.

When the higher temperature of 600° C. was used for conducting the reaction and the ratio of hydrochloric acid to trimethylindium was 4, well aligned nanorods as well as randomly oriented nanorods was produced on the substrates. Well aligned nanorods were produced on the silicon substrate, the gallium nitride substrate, the gallium nitride-silicon substrate and on the alumina substrate. Randomly oriented nanorods were produced on the silicon substrate having a (111) orientation and on the alumina substrate.

Figure 6:
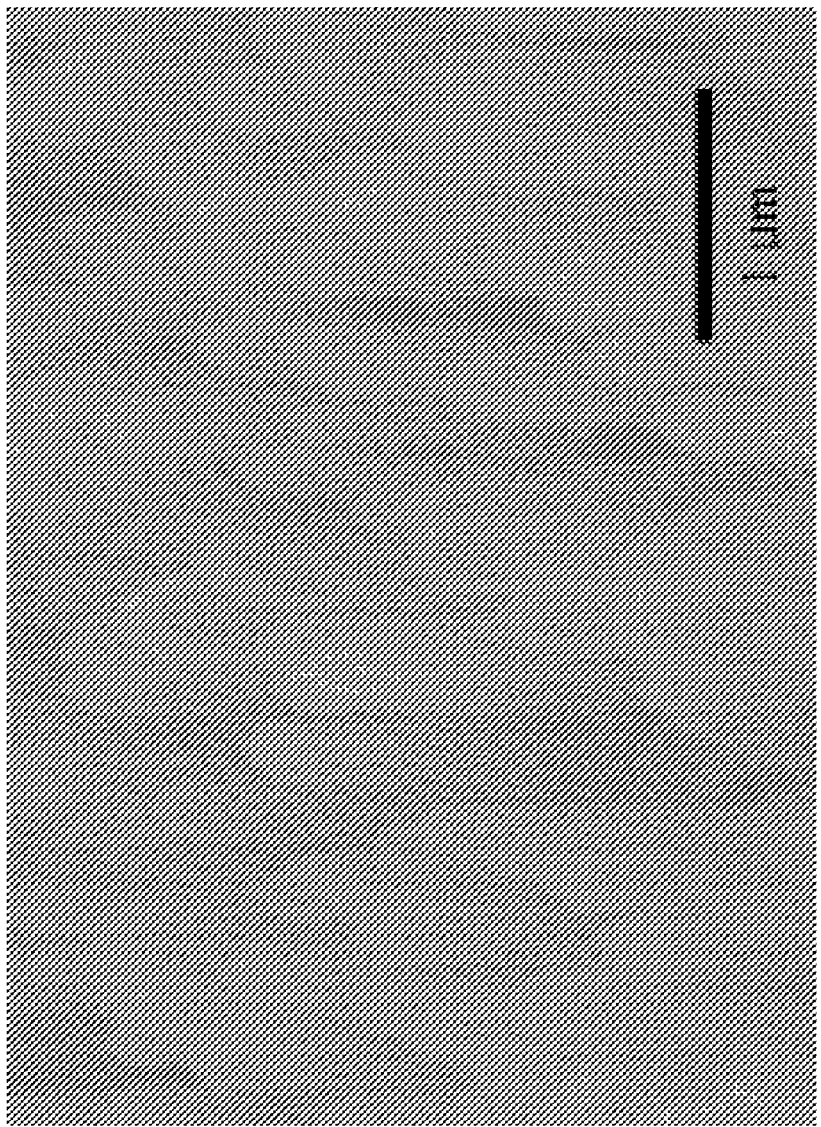
FIG. 6 is a micrograph that shows well aligned nanorods.

The well aligned nanorods are depicted in the micrograph shown in the FIG. 6. As can be seen in the FIG. 6, all of the indium nitride nanorods are aligned in the same direction. An xray diffraction pattern shown in the FIG. 7 reveals that all of the indium nitride nanorods are aligned in only the c-direction (i.e., perpendicular to the substrate).

Figure 7:
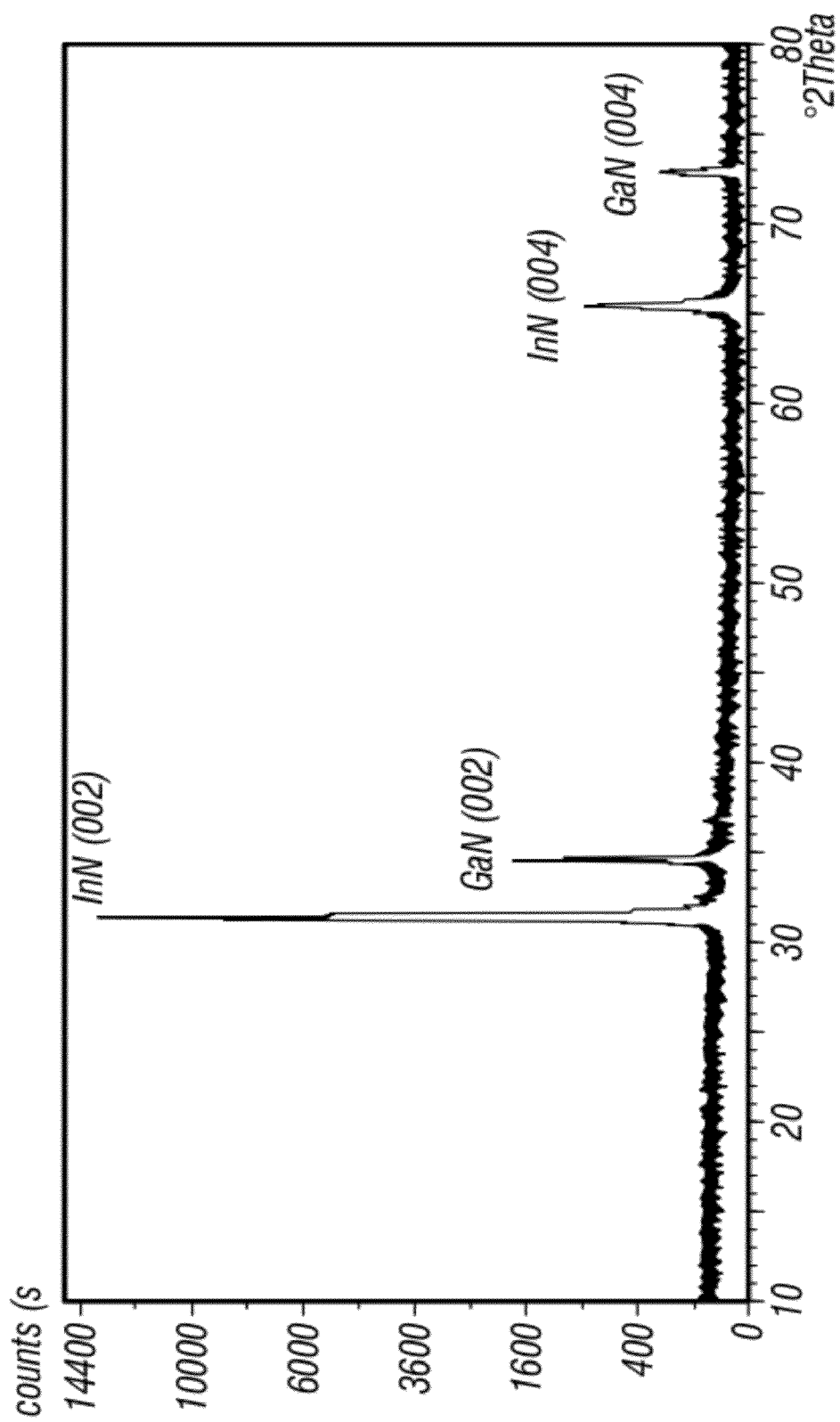
FIG. 7 is an xray diffraction pattern that shows that all of the indium nitride nanorods are aligned in only the c-direction (i.e., perpendicular to the substrate)
Figure 8:
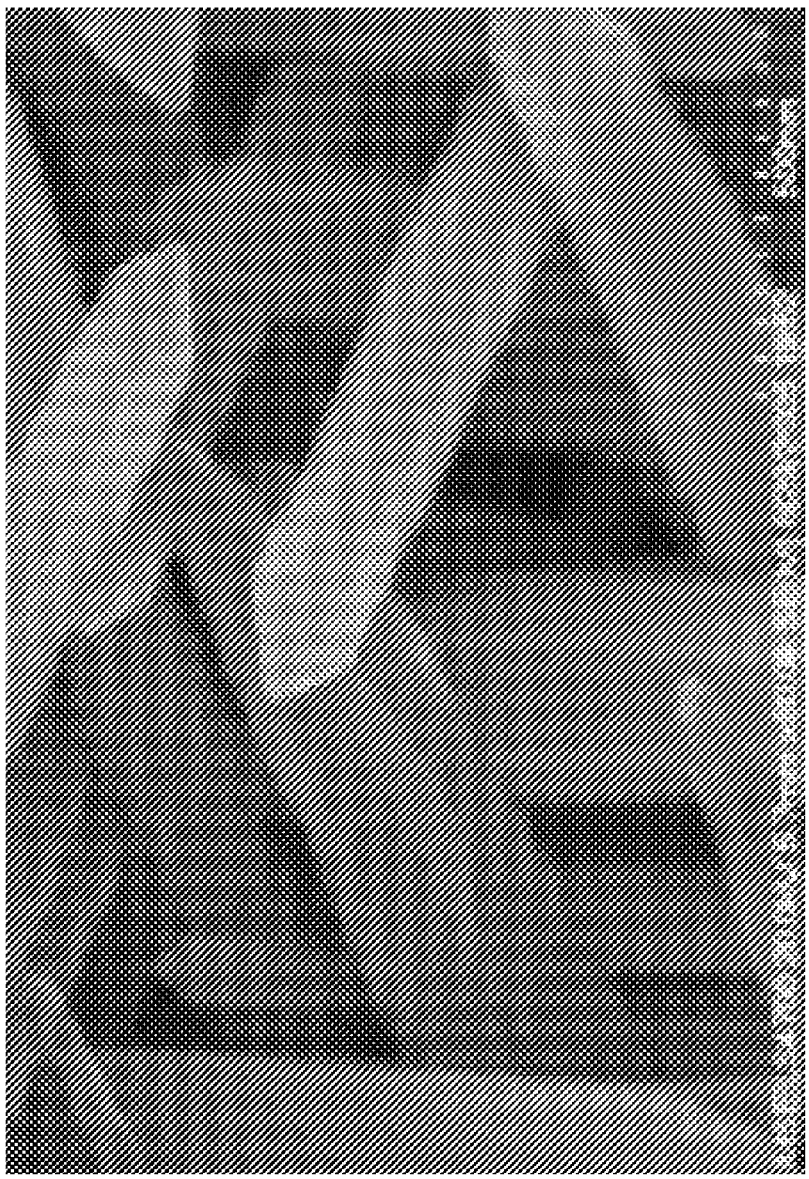
FIG. 8 is a micrograph of randomly oriented indium nitride nanorods on an alumina substrate.
Figure 9:
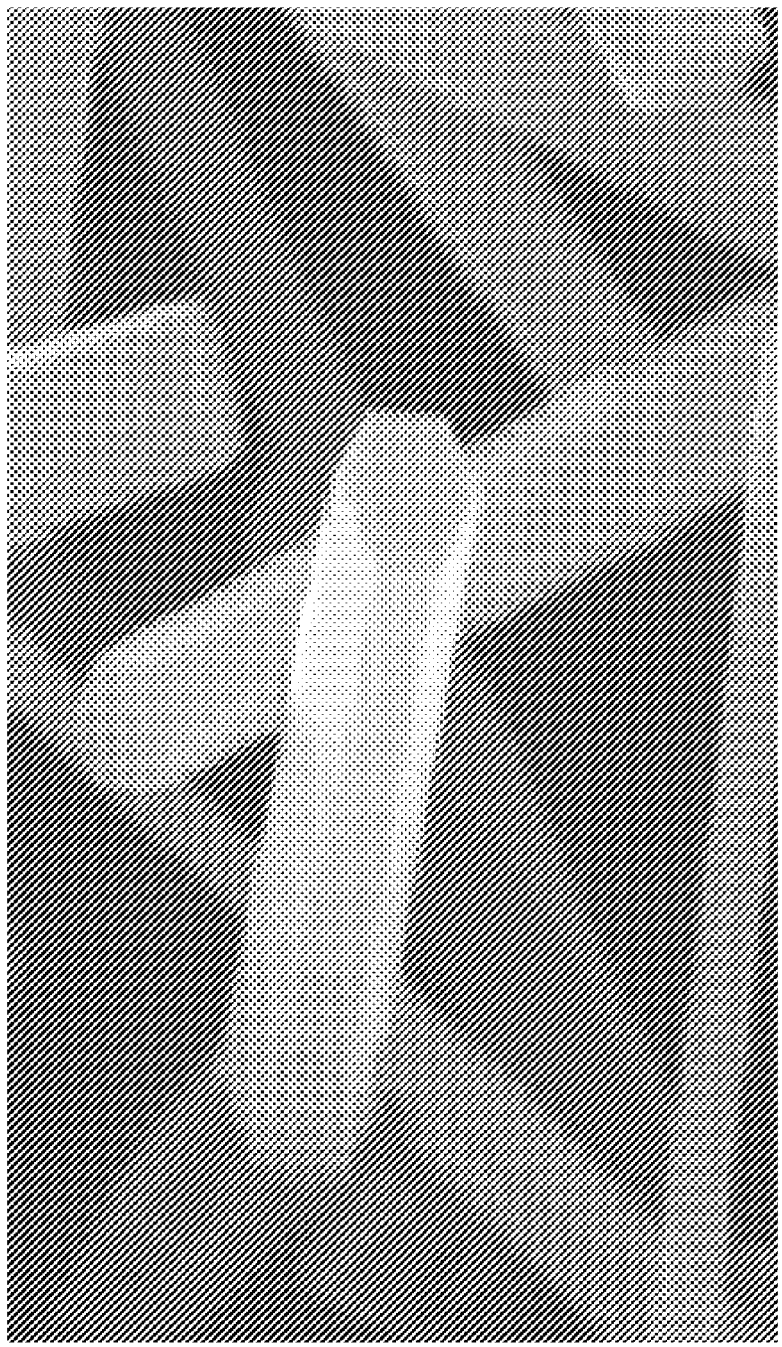
FIG. 9 is a micrograph of randomly oriented indium nitride nanorods on the silicon (111) substrate.
Figure 10:
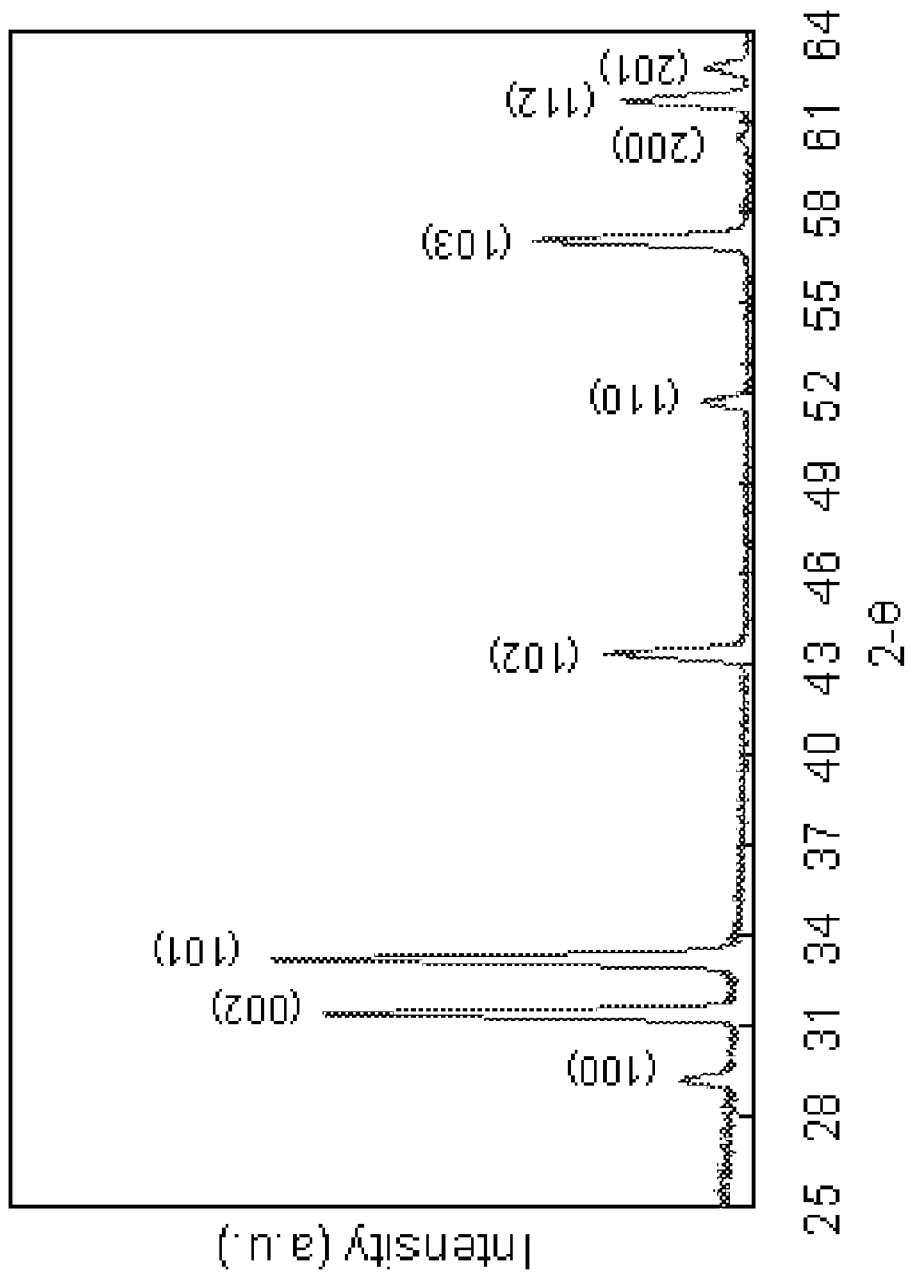
FIG. 10 is an xray diffraction pattern for the randomly oriented nanorods of the FIG. 9.

The randomly oriented indium nitride nanorods are depicted in the micrograph shown in the FIGS. 7 and 8. The FIG. 8 shows a micrograph of randomly oriented indium nitride nanorods on the alumina substrate while the FIG. 9 shows a micrograph of the randomly oriented indium nitride nanorods on the silicon (111) substrate. An xray diffraction pattern for the randomly oriented nanorods is shown in the FIG. 10. The xray diffraction pattern in the FIG. 10, shows a larger number of peaks than that in the FIG. 7 indicating a more random orientation for the nanorods.

From the experiments above it can be seen that by varying the temperature and the ratio of the halogen containing compound to the reactive precursor, the type of interlayer can be changed. At lower temperatures of about 400 to about 550° C., and at lower mole ratios of the halogen containing compound to the reactive precursor of about 0.5 to about 2, columnar films are produced, while at higher temperatures of about 575° C. to about 700° C. and at higher mole ratios of the halogen containing compound to the reactive precursor of about 2.5 to about 5 nanorods are produced.

Without being limited to theory it is believed that interlayers comprising well aligned nanorods generally produce better group-III nitride layers because they are well aligned in a direction perpendicular to the substrate, which is the preferential growth direction for the group-III nitride layer.

While the invention has been described with reference to some embodiments, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. An article comprising:
a substrate;
an interlayer comprising aluminum nitride, gallium nitride, boron nitride, indium nitride or a solid solution of aluminum nitride, gallium nitride, boron nitride and/or indium nitride; the interlayer being directly disposed upon the substrate and in contact with the substrate; where the interlayer comprises a columnar film and/or nanorods and/or nanotubes; and
a group-III nitride layer disposed upon the interlayer; where the group-III nitride layer completely covers a surface of the interlayer that is opposed to a surface in contact with the substrate; the group-III nitride layer being free from cracks, wherein the interlayer is in direct contact with the group-III nitride layer.

2. The article of claim 1, where the substrate comprises silicon, SiC, sapphire (c-, a-, r- or m-oriented; on axis or of-cut), $LiAlO_2$, $LiGaO_2$, gallium arsenide, glass, alumina, titania, zirconia, germanium, a combination of germanium and silicon, aluminum nitride, indium nitride, boron nitride, gallium nitride or a solid solution of aluminum nitride, indium nitride, boron nitride and/or gallium nitride, quartz and glass.

3. The article of claim 1, where the interlayer comprising a solid solution of aluminum nitride, gallium nitride, boron nitride and/or indium nitride comprises aluminum indium nitride, indium boron nitride, aluminum boron nitride, gallium boron nitride, aluminum gallium nitride, gallium indium nitride, aluminum indium gallium nitride, indium gallium boron nitride, aluminum gallium boron nitride, aluminum gallium boron nitride, indium aluminum boron nitride, or aluminum gallium indium boron nitride.

4. The article of claim 1, where the interlayer comprises a chemical composition represented by the Equation (I):

$$A_xB_yC_zN \quad (I)$$

where $x+y+z=1$ and x is an amount of about 0 to about 1, y is an amount of about 0 to about 1 and z is an amount of about 0 to about 1; where A, B and C can be the same or different and can be selected from amongst indium, aluminum, boron or gallium and where N is nitrogen.

5. The article of claim 1, where the columnar film comprises columns having an average column diameter of about 0.1 micrometer to about 1 micrometer.

6. The article of claim 1, where the nanorods are aligned to be substantially perpendicular to the substrate.

7. The article of claim 1, where the nanorods are randomly aligned.

8. The article of claim 1, where the substrate comprises silica, alumina or gallium nitride, the interlayer comprises indium nitride and the group-III layer comprises gallium nitride.

9. The article of claim 1, where the substrate further comprises a buffer layer.

10. The article of claim 9, where the buffer layer comprises nuclei that nucleate the nanorods.

11. The article of claim 10, where the nuclei comprise a native group-III nitride or an alloy of a native group-III nitride.

12. A method comprising:
disposing on a substrate an interlayer comprising interlayer comprising aluminum nitride, gallium nitride, boron nitride, indium nitride or a solid solution of aluminum nitride, gallium nitride, boron nitride and/or indium nitride; the interlayer being directly disposed upon the substrate and in contact with the substrate; where the interlayer comprises a columnar film and/or nanorods and/or nanotubes; and
disposing on the interlayer a group-III nitride layer; where the group-III nitride layer is free from cracks and wherein the interlayer is in direct contact with the group-III nitride layer.

13. The method of claim 12, further comprising disposing a buffer layer on the substrate, the buffer layer comprising a native group-III nitride or an alloy of a native group-III nitride.

14. The method of claim 12, where the interlayer is disposed on the substrate at a temperature of about 400 to about 800° C.

15. The method of claim 12, where the interlayer is disposed on the substrate at a temperature of about 575 to about 700° C.

16. The method of claim 12, where the interlayer is disposed on the substrate by reacting a first reactive precursor with a halogen containing compound and a nitrogen containing compound.

17. The method of claim 16, where the first reactive precursor is selected from the group consisting of boron tribromide, trimethylaluminum, ethyldimethylindium, boron trichloride, trimethylgallium, triethylgallium, trimethylindium, triethylindium, and a combination comprising at least one of the foregoing reactive precursors.

18. The method of claim 16, wherein a ratio of the halogen containing compound to the first reactive precursor is about 1 to about 6.

19. The method of claim 16, wherein a ratio of the halogen containing compound to the first reactive precursor is about 2 to about 4.

* * * * *